United States Patent
Zhou et al.

(10) Patent No.: US 7,019,978 B2
(45) Date of Patent: Mar. 28, 2006

(54) HEAT DISSIPATING DEVICE INCORPORATING CLIP

(75) Inventors: Wei-Guo Zhou, Shenzhen (CN); Gen-Cai Wang, Shenzhen (CN); Xiao-Yan Tang, Shenzhen (CN)

(73) Assignee: Hon Hai Precision Industry Co., Ltd., (TW)

( * ) Notice: Subject to any disclaimer, the term of this patent is extended or adjusted under 35 U.S.C. 154(b) by 26 days.

(21) Appl. No.: 10/891,949

(22) Filed: Jul. 15, 2004

(65) Prior Publication Data

US 2005/0180114 A1   Aug. 18, 2005

(30) Foreign Application Priority Data

Feb. 14, 2004   (CN) ........................ 200420042625

(51) Int. Cl.
   *H05K 7/20*   (2006.01)

(52) U.S. Cl. ...................... 361/704; 257/718; 257/727; 174/16.3; 165/80.3; 24/505; 24/510

(58) Field of Classification Search ................ 361/704, 361/709, 719; 257/706, 712, 718, 727; 165/80.3, 165/185; 24/505, 510, 457
See application file for complete search history.

(56) References Cited

U.S. PATENT DOCUMENTS

| | | | |
|---|---|---|---|
| 6,396,695 B1 * | 5/2002 | Lee et al. .................... | 361/704 |
| 6,404,633 B1 * | 6/2002 | Hsu ............................ | 361/703 |
| 6,449,152 B1 * | 9/2002 | Lin ............................. | 361/697 |
| 2002/0181205 A1 * | 12/2002 | Shia et al. ................... | 361/704 |
| 2003/0151899 A1 * | 8/2003 | Lee et al. .................... | 361/719 |
| 2004/0017660 A1 * | 1/2004 | Tseng et al. ................ | 361/704 |

FOREIGN PATENT DOCUMENTS

| | | |
|---|---|---|
| TW | 468826 | 12/2001 |
| TW | 474553 | 1/2002 |
| TW | 477515 | 2/2002 |
| TW | 481300 | 3/2002 |
| TW | 566601 | 12/2003 |

* cited by examiner

*Primary Examiner*—Boris Chervinsky
(74) *Attorney, Agent, or Firm*—Morris Manning & Martin; Tim Tingkang Xia, Esq.

(57) ABSTRACT

A heat dissipating device for a heat generating unit, includes a heat sink placed on the heat generating unit, and two clip members located at opposite sides of the heat sink for securing the heat sink to the heat generating unit. Each clip member includes an operating member movably attached to the heat sink, and a fastening member connected with the operating member. The operating member is movable from a lower position to an upper position to cause the bottom portion of the fastening member to move upwardly via the operating member acting on the fastening member.

16 Claims, 4 Drawing Sheets

HEAT DISSIPATING DEVICE INCORPORATING CLIP

This application is cross-reference to the prior U.S. patent application Ser. No. 10/823,063 field on Apr. 12, 2004.

TECHNICAL FIELD

The present invention relates to a heat dissipating device, and particularly to a heat dissipating device incorporating clips which can conveniently mount the heat dissipating device to heat generating units.

BACKGROUND

As computer technology continues to advance, electronic components such as central processing units (CPUs) of computers are being made to provide faster operational speeds and greater functional capabilities. When a CPU operates at a high speed in a computer enclosure, its temperature can increase greatly. It is desirable to dissipate the generated heat quickly, for example, by using a heat sink attached to the CPU in the enclosure. This allows the CPU and other high-performance electronic components in the enclosure to function within their normal operating temperature ranges, thereby assuring the CPU quality of data management, storage and transfer. Often times, a clip is required for mounting the heat sink to the CPU.

One conventional heat dissipating device developed to cool CPUs is illustrated in FIG. 4. The heat dissipating device comprises a heat sink 100 and a clip 200. The heat sink 100 comprises a base 102 having a plurality of heat dissipating fins 104 extending therefrom. A channel 106 is formed between the fins 104 for receiving the clip 200 therein. The clip 200 comprises a pressing body 202 and a pair of latching arms 204, 206 extending from opposite ends of the pressing body 202. Each latching arms 204, 206 is bent at a suitable angle relative to the pressing body 202. Each latching arms 204, 206 includes a sloped portion 208 to connect to the pressing body 202. A handle tab 210 extends outward from the latching arm 206 and defines a slot 212 therein for facilitating tool operations therein.

However, it is complicated to use the tool operations. Furthermore, the wide channel 106 takes up space that would otherwise be utilized to provide more fins for the heat sink 100. In effect, the clip 200 reduces the heat dissipating area of the heat sink 100, and therefore reduces the heat dissipating capability of the heat sink 100. Moreover, the sloped portion 208 of the clip 200 in the heat sink 100 will baffle the passing air flow from a fan mounted on the heat sink 100, thereby reducing the heat dissipating efficiency of the heat sink 100.

Therefore, an improved heat dissipating device for a heat generating unit which overcomes the above problems is desired.

SUMMARY OF THE INVENTION

Accordingly, an object of the present invention is to provide a heat dissipating device incorporating clip members which can conveniently mount the heat dissipating device to a heat generating unit without reducing heat dissipating capability of the heat dissipating device.

To achieve the above-mentioned object, a heat dissipating device comprises a retention module about a heat generating unit, a heat sink placed on the heat generating unit, and two clip members located at opposite sides of the heat sink for securing the heat sink on the heat generating unit. Each clip member comprises an operating member movably attached to the heat sink, and a fastening member connected with the operating member. The operating member is movable from a lower position to an upper position to cause the fastening member to move from a releasing position to a locking position to engage with the retention module via the operating member acting on the fastening member.

Other objects, advantages and novel features of the present invention will be drawn from the following detailed description of a preferred embodiment of the present invention together with the attached drawings, in which:

DETAILED DESCRIPTION OF PREFERRED EMBODIMENTS

Figure 1:
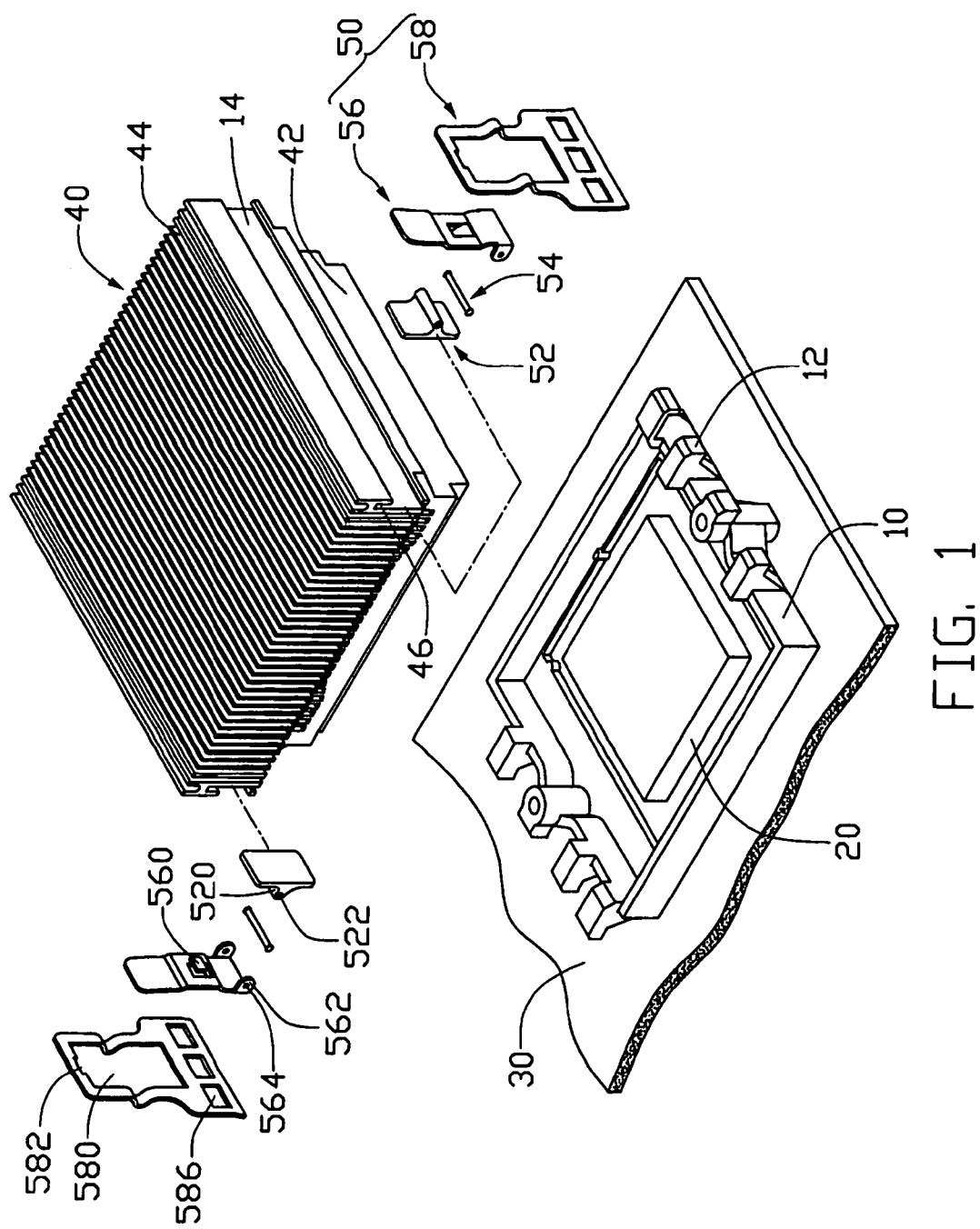
FIG. 1 is an exploded view of a heat dissipating device in accordance with a first preferred embodiment of the present invention.
Figure 2:
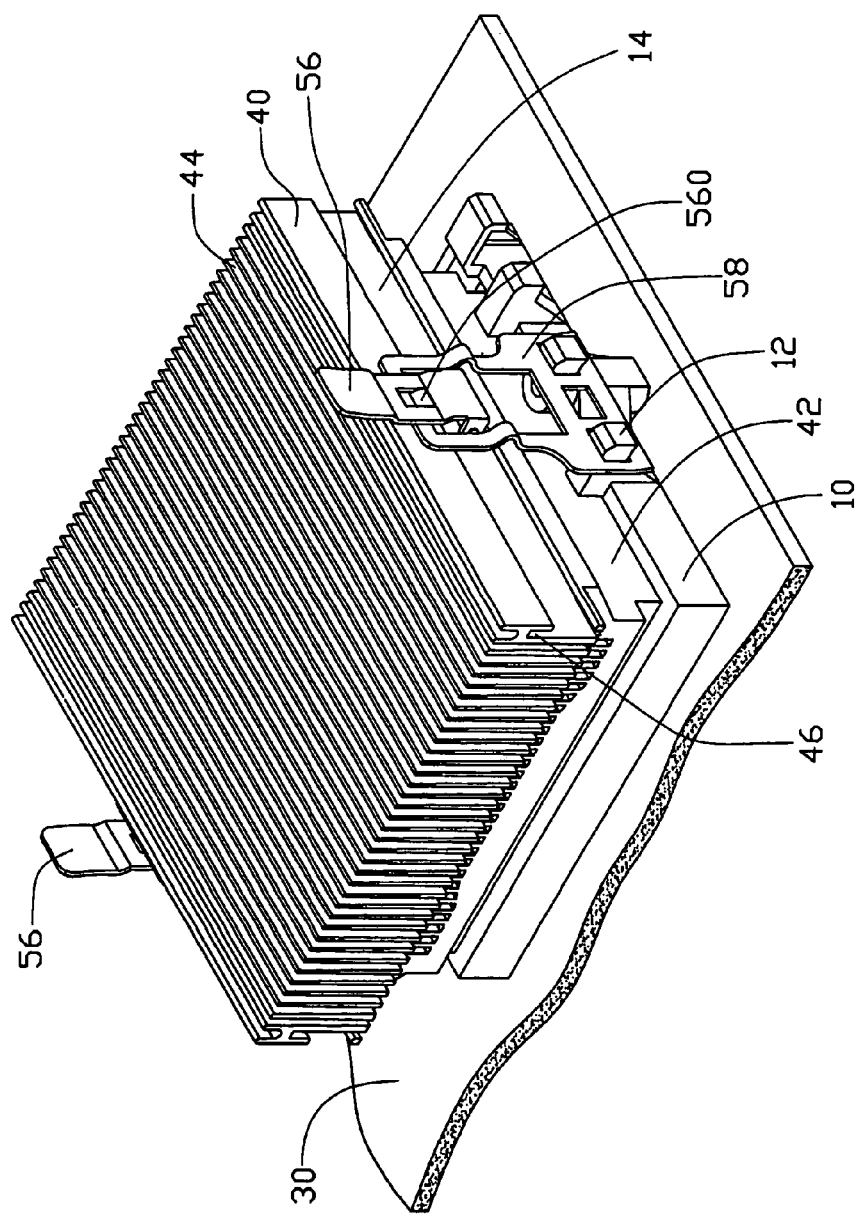
FIG. 2 is an assembled view of FIG. 1.

Referring to FIGS. 1 and 2, a heat dissipating device in accordance with a first preferred embodiment of the present invention comprises a retention module 10 surrounding a heat generating unit 20 mounted on a printed circuit board 30, a heat sink 40, and two clip members 50 cooperating with the retention module 10 to secure the heat sink 40 onto the heat generating unit 20.

The heat sink 40 comprises a base 42 and a plurality of heat dissipating fins 44 extending from a top surface of the base 42. A bottom surface of the base 42 directly contacts with the heat generating unit 20. Each outmost fin 14 defines a groove 46 extending between two opposite sides thereof.

The retention module 10 is a square frame. Each of two opposite sides of the retention module 10 forms a plurality of locking blocks 12 extending outwardly therefrom.

Two retaining members 52 with a board configuration are inserted in the grooves 46. A protrusion 520 is formed outwardly from one side face of each retaining member 52. A first pivot hole 522 is defined in each protrusion 520.

Each clip member 50 comprises an operating member 56 with a lever configuration pivotably attached on the retaining member 52, and a fastening member 58 with a plate configuration used to detachably engage with the retention module 10 by means of its lower portion.

The operating member 56 comprises a claw 560 formed inwardly from the middle portion of the operating member 56. Two parallel tabs 562 are inwardly formed on two opposite side edges of one end of the operating member 56. A pair of coaxial second pivot holes 564 are defined in the tabs 562. The operating member 56 is pivotably attached to the retaining member 52 by inserting a pivot shaft 54 through the first and second pivot holes 522, 564 sequently.

The fastening member 58 defines an aperture 580 on an upper portion thereof. A connecting portion is therefore formed above the aperture 580. A cutout 582 is defined in the connecting portion in communication with the aperture 580, corresponding to the claw 560 of the retaining member 52. A plurality of openings 586 for clasping with the locking blocks 12 of the retention module 10 is defined in the lower potion of the fastening member 58.

In assembly, the retaining members 52 are inserted in the corresponding grooves 46 of the heat sink 40 respectively. The operating members 56 are then attached to the retaining members 52 with the pivot shafts 54 received in the first and second pivot holes 522, 564. At this time, the operating members 56 are located at lower positions. The heat sink 10 with the retaining members 52 and the operating members 56 is placed in the retention module 10 with the base 12 contacting with the heat generating unit 20. The connecting portions of the fastening members 58 are supported on the claws 560 of the operating members 56 by means of the cutouts 582. The openings 586 of the fastening members 58 are disengaged from the locking blocks 12 of the retention module 10 at this moment. The operating members 56 are then driven to rotate from the lower positions to corresponding upper positions, and the lower portions of the fastening members 58 are accordingly moved upwardly to cause the openings 586 of the fastening members 58 to clasp the locking blocks 12 of the retention module 10. The heat sink 40 is thus firmly attached to the heat generating unit 20 by the clip members 50.

It is understood that the claw 560 of the operating member 56 can be other alternative structures, so far as the lower portion of the fastening members 58 can simultaneously move upwardly with the operating member 56 via rotational movement of the operating members 56 when the operating members 56 move from lower positions to upper positions. Alternatively, the heat sink 40 can be also other alternative structures, for example, the retaining member 52 can be secured on each outmost fin 14 of the heat sink 40 by screws.

Figure 3:
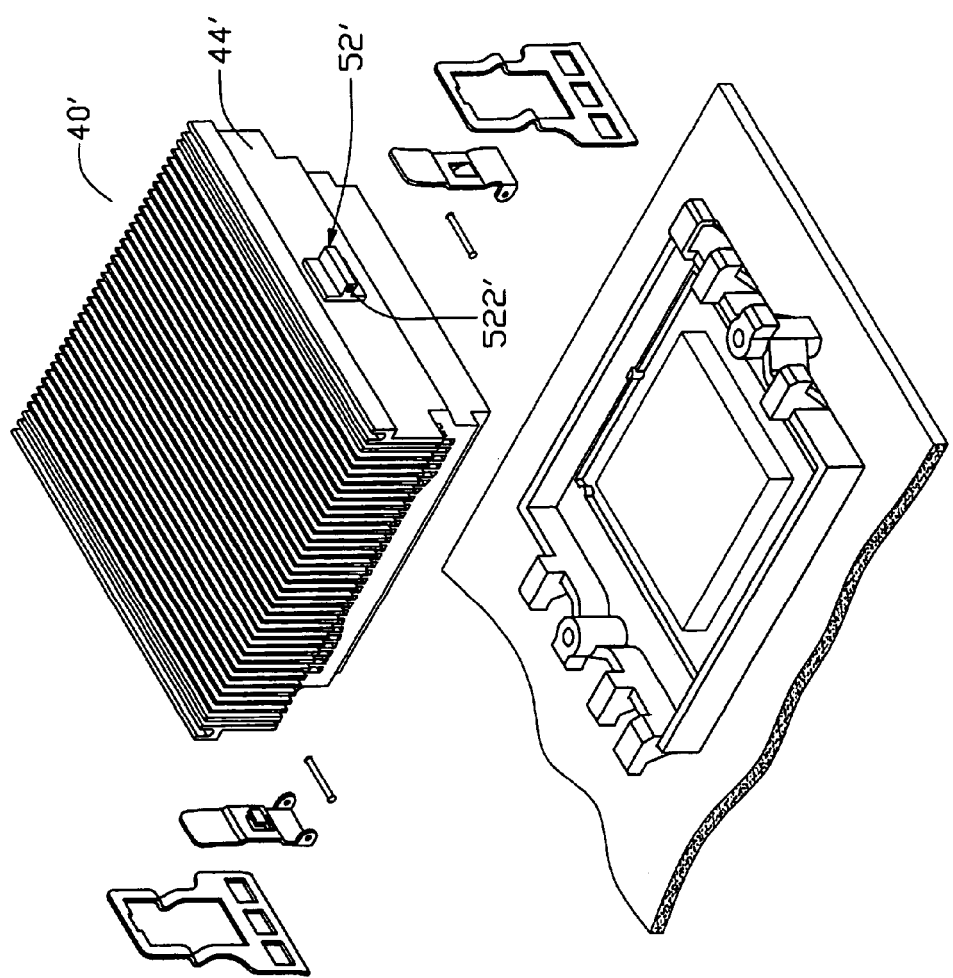
FIG. 3 is an exploded view of another heat dissipating device in accordance with a second preferred embodiment of the present invention.
Figure 4:
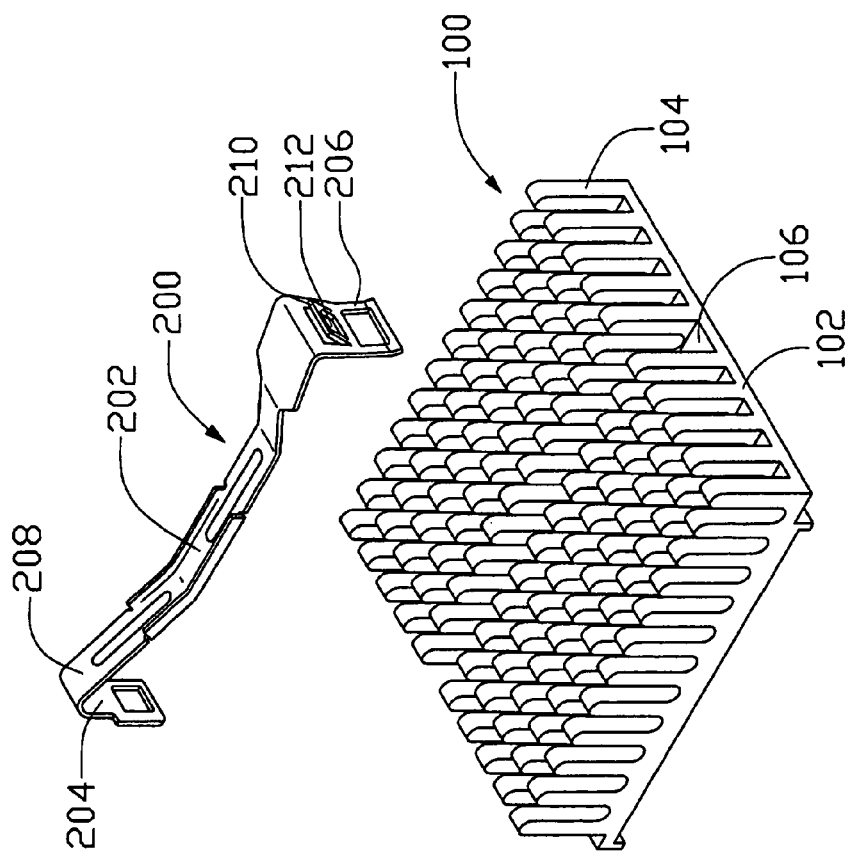
FIG. 4 is an exploded view of a conventional heat dissipating device.

FIG. 3 shows another heat dissipating device in accordance with a second preferred embodiment of the present invention. The heat dissipating device of the second preferred embodiment is similar to the heat dissipating device of the first preferred embodiment except each outmost fin 44' of the heat sink 40' thereof integrally forming a protrusion 52' on an outer surface of outmost fins 44' of the heat sink 40'. A pivot hole 522' is defined in each protrusion 52'.

In the present invention, it is convenient to operate the operating member 56 without using of tool operations. Furthermore, the clips 50 do not extend through any of fins of the heat sink. Because the fins are unaltered, they provide a maximum possible heat dissipating area for the heat sink.

It is understood that the invention may be embodied in other forms without departing from the spirit thereof. Thus, the present examples and embodiments are to be considered in all respects as illustrative and not restrictive, and the invention is not to be limited to the details given therein.

What is claimed is:

1. A heat dissipating device for a heat generating unit, comprising:
   a retention module adapted for being located about the heat generating unit;
   a heat sink adapted for being placed on the heat generating unit;
   two clip members located at opposite sides of the heat sink, each clip member comprising an operating member at a pivot position pivotably attached to the heat sink, and a fastening member connected with the operating member at a connection position above said pivot position and engaged with the retention module for securing the heat sink to the heat generating unit.

2. The heat dissipating device as described in claim 1, wherein each operating member forms inwardly a claw from a middle portion thereof, and each fastening member defines a cutout in an upper portion thereof for engaging with the claw of the operating member.

3. The heat dissipating device as described in claim 1, wherein the retention module comprises a plurality of locking blocks extending outwardly therefrom and each fastening member defines a plurality of openings in a lower portion thereof to clasp with the locking blocks.

4. The heat dissipating device as described in claim 2, wherein two grooves are defined at opposite outmost fins of the heat sink.

5. The heat dissipating device as described in claim 4, further comprising two retaining members inserted in the grooves, and wherein the operating member is pivotably attached to the retaining members.

6. The heat dissipating device as described in claim 5, wherein each retaining member defines a first pivot hole therein and the operating member comprises a pair of tabs defining second pivot holes therein, a pivot shaft extending through the first and second pivot holes.

7. The heat dissipating device as described in claim 1, wherein each of opposite outmost fins of the heat sink comprises a protrusion integrally formed on an outer surface thereof, and each operating member is pivotably attached on a corresponding protrusion.

8. The heat dissipating device as described in claim 7, wherein each protrusion defines a first pivot hole therein and the operating member defines second pivot holes on one end thereof, a pivot shaft extending through the first and second pivot holes.

9. A combination comprising:
   a heat sink adapted for being placed on a heat generation unit; and
   a pair of clip members provided at opposite sides of the heat sink, each clip comprising:
   an operating member movably attached to the heat sink; and
   a fastening member connected with the operating member, wherein the operating member is movable from a lower position to an upper position to cause the fastening member to move from a releasing position to a locking position via the operating member acting on the fastening member.

10. The combination as described in claim 9, wherein the operating member comprises a claw formed inwardly therefrom, and the fastening member defines a cutout in an upper portion thereof for engaging with the claw of the operating member.

11. The combination as described in claim 10, wherein the fastening member defines a plurality of openings on the bottom portion.

12. The combination as described in claim 11, wherein the fastening member defines an opening and the operating member extends from the heat sink through the opening.

13. The combination as described in claim 9, wherein when the operating member is moved from the lower position to the upper position the lower portion of the fastening member is moved upwardly via the operating member acting on the fastening member.

14. A combination comprising:
   a heat generating unit with a pair of locking means provided on opposite sides thereof;
   a heat sink placed on the heat generating device; and
   a clip member located at each of opposite sides of the heat sink, said clip member comprising an operating member pivotably attached to the heat sink, a fastening member detachably connected to the operating member, wherein the operating member is pivotable between a first position at which the fastening member is disengaged from a corresponding locking means and a second position at which the fastening member is engaged with the corresponding locking means.

15. The combination as described in claim 14, wherein the fastening member comprises a connecting portion connected to the operating member and located between the heat sink and the operating member.

16. The combination as described in claim 15, wherein the fastening member defines an opening below the connecting portion and the operating member extends from the heat sink through the opening to upside of the connecting portion.

* * * * *